US008539146B2

(12) United States Patent  
Brittain et al.

(10) Patent No.: US 8,539,146 B2
(45) Date of Patent: Sep. 17, 2013

(54) APPARATUS FOR SCHEDULING MEMORY REFRESH OPERATIONS INCLUDING POWER STATES

(75) Inventors: Mark A. Brittain, Pflugerville, TX (US); John Steven Dodson, Pflugerville, TX (US); Benjiman L. Goodman, Cedar Park, TX (US); Stephen J. Powell, Austin, TX (US); Jeffrey A. Stuecheli, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 13/305,200

(22) Filed: Nov. 28, 2011

(65) Prior Publication Data

US 2013/0138878 A1   May 30, 2013

(51) Int. Cl.
G06F 12/00   (2006.01)

(52) U.S. Cl.
USPC .......................................... 711/106

(58) Field of Classification Search
USPC .......................................... 711/106
See application file for complete search history.

(56) References Cited

U.S. PATENT DOCUMENTS

| | | | | |
|---|---|---|---|---|
| 5,557,578 | A | * | 9/1996 | Kelly ............................... 365/222 |
| 5,712,825 | A | | 1/1998 | Hadderman et al. |
| 7,734,866 | B2 | | 6/2010 | Tsem |
| 7,742,355 | B2 | | 6/2010 | Kohler et al. |
| 2001/0009022 | A1 | | 7/2001 | Feierbach |
| 2002/0038412 | A1 | | 3/2002 | Nizar et al. |
| 2004/0047228 | A1 | | 3/2004 | Chen |
| 2008/0049542 | A1 | | 2/2008 | Lee et al. |
| 2010/0095058 | A1 | | 4/2010 | Proebsting |
| 2010/0128547 | A1 | | 5/2010 | Kagami |
| 2012/0144105 | A1 | | 6/2012 | Dodson et al. |

FOREIGN PATENT DOCUMENTS

| | | |
|---|---|---|
| JP | 10-149311 A | 6/1998 |
| JP | 2002-288035 A | 10/2002 |
| JP | 2004-55084 A | 2/2004 |
| JP | 2005-107648 A | 4/2005 |
| KR | 20080072957 A | 8/2008 |
| WO | 03032170 A1 | 4/2003 |

OTHER PUBLICATIONS

Baca, M., Patent Application filed Dec. 3, 2010, U.S. Appl. No. 12/959,637, entitled Techniques for Performing Refresh Operations in High-Density Memories (amended).

(Continued)

*Primary Examiner* — Duc Doan
(74) *Attorney, Agent, or Firm* — Yudell Isidore Ng Russell PLLC

(57) ABSTRACT

A method for performing refresh operations on a rank of memory devices is disclosed. After the completion of a memory operation, a determination is made whether or not a refresh backlog count value is less than a predetermined value and the rank of memory devices is being powered down. If the refresh backlog count value is less than the predetermined value and the rank of memory devices is being powered down, an Idle Count threshold value is set to a maximum value such that a refresh operation will be performed after a maximum delay time. If the refresh backlog count value is not less than the predetermined value or the rank of memory devices is not in a powered down state, the Idle Count threshold value is set based on the slope of an Idle Delay Function such that a refresh operation will be performed accordingly.

11 Claims, 4 Drawing Sheets

(56) References Cited

OTHER PUBLICATIONS

Ng, A., Preliminary Amendment filed Apr. 24, 2012, U.S. Appl. No. 12/959,637, entitled Techniques for Performing Refresh Operations in High-Density Memories (amended).

Kaseridis et al: "Elastic Refresh: Techniques to Mitigate Refresh Penalties in High Density Memory"; 43rd International Symposium on Microarchitecture (MICRO), Dec. 2010 (10 pp).

Bhat et al: "Making DRAM refresh predictable"; Department of Computer Science, North Carolina State University, Raleigh, NC; Springer Science+Business Media, LLC 2011; Published online: May 12, 2011.

Japan Patent Office; Int'l Application PCT/JP2012/006378 filed Oct. 4, 2012; International Search Report and Written Opinion dated Dec. 3, 2012 (8 pgs.).

U.S. Appl. No. 12/959,637 entitled "Techniques for Performing Refresh Operations in High-Density Memories"; Notice of Allowance dated Mar. 11, 2013.

\* cited by examiner ific Field
The present disclosure relates to memory refresh operations in general, and in particular to a method for scheduling refresh operations in high-density memories.

APPARATUS FOR SCHEDULING MEMORY REFRESH OPERATIONS INCLUDING POWER STATES

BACKGROUND OF THE INVENTION

1. Technical Field

The present disclosure relates to memory refresh operations in general, and in particular to a method for scheduling refresh operations in high-density memories.

2. Description of Related Art

Dynamic random-access memories (DRAMs) are widely employed in a variety of applications. A typical DRAM has multiple blocks of memory cells, and each memory cell includes a capacitor and an access transistor. The capacitor stores a charge related to the value of data stored in a memory cell, and the access transistor selectively couples the capacitor to a bitline for reading from or writing to the memory cell.

Because of various leakage paths, a charge stored within a capacitor of a memory cell will typically dissipate in less than few tens of milliseconds. In order to maintain the integrity of data stored in a memory cell, the memory cell needs to be periodically refreshed by reading the data in the memory cell and rewriting the read data back into the memory cell before the stored charge has had the opportunity to dissipate.

According to the JEDEC standard, a DRAM device maintains an internal counter that designates the next segment of the DRAM device to be refreshed, and a memory controller issues an address-less Refresh command to the DRAM device. Two key JEDEC parameters that are closely associated with refresh operations are $t_{REFI}$ and $t_{RFC}$. Parameter $t_{REFI}$ specifies the interval at which Refresh commands must be sent to a DRAM device, and parameter $t_{RFC}$ specifies the amount of time that a DRAM device interface is being tied up by each refresh operation.

Most conventional memory controllers simply send refresh operations whenever $t_{REFI}$ (which dictates a refresh timer) expires. This is sufficient for older computer systems where each refresh operation can be completed quickly such that read and/or write operations do not need to be delayed for a very long time. However, for high-density DRAM chips, such as 4-Gbit and 16-Gbit DRAM chips, a refresh operation generally takes quite some time to complete. The net effect is a measurable increase in effective memory latency when read and/or write operations are frequently required to be stalled in order to accommodate refresh operations.

Consequently, it would be desirable to provide an improved method and apparatus for performing refresh operations in high-density memories.

SUMMARY OF THE INVENTION

In accordance with a preferred embodiment of the present disclosure, in response to a completion of a memory operation of a memory device, a determination is made whether or not a refresh backlog count value is greater than a first predetermined value. If the refresh backlog count value is greater than the first predetermined value, a refresh operation is performed as soon as possible. If the refresh backlog count value is not greater than the first predetermined value, another determination is made whether or not the refresh backlog count value is less than a second predetermined value. If the refresh backlog count value is not less than the second predetermined value, another determination is made whether or not the refresh backlog count value is less than a third predetermined value and the rank of memory devices is in a powered down state. If the refresh backlog count value is less than the third predetermined value and the rank of memory devices is in a powered down state, then an Idle Count threshold value is set to a maximum value such that a refresh operation will be performed after a maximum delay time. If the refresh backlog count value is not less than the third predetermined value or the rank of memory devices is not in a powered down state, then the Idle Count threshold value is set based on the slope of an Idle Delay Function such that a refresh operation will be performed accordingly.

All features and advantages of the present disclosure will become apparent in the following detailed written description.

BRIEF DESCRIPTION OF THE DRAWINGS

The disclosure itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
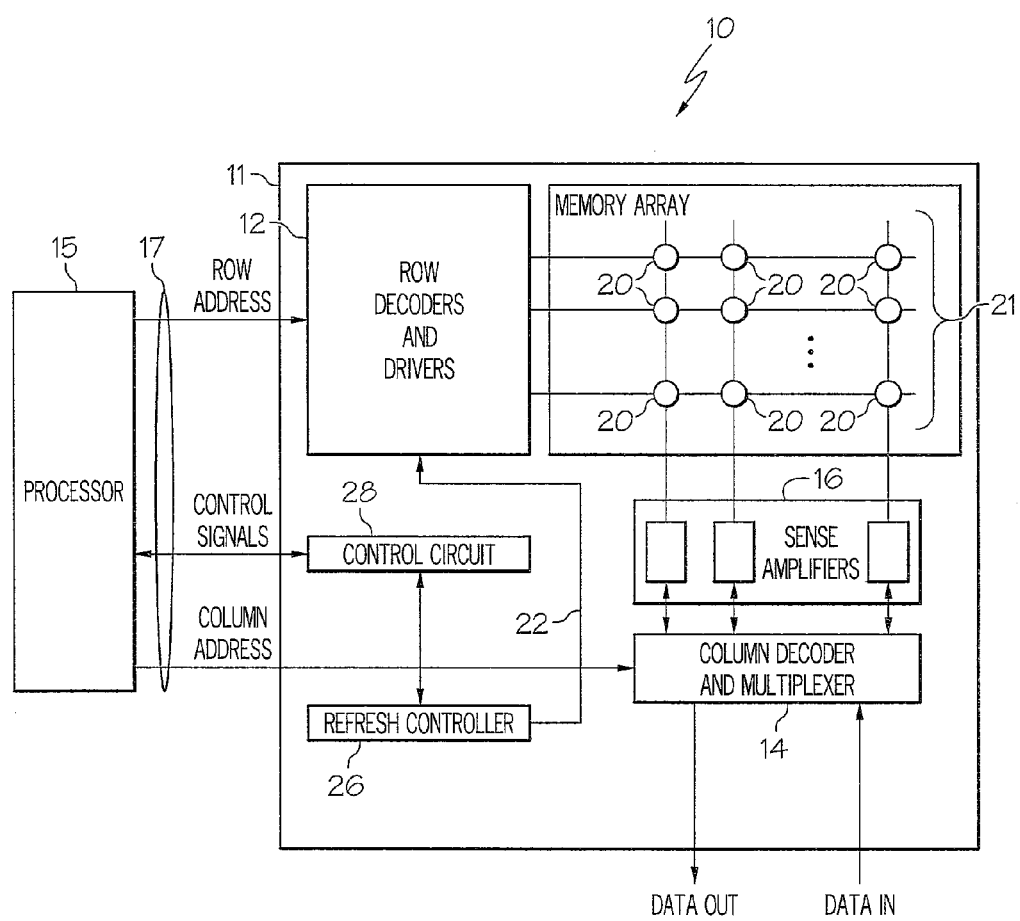
FIG. 1 is a block diagram of an electronic system having a dynamic random-access memory in which a preferred embodiment of the present invention can be implemented.

Referring now to the drawings and in particular to FIG. 1, there is depicted a block diagram of an electronic system having a dynamic random-access memory (DRAM) device in which a preferred embodiment of the present invention can be implemented. As shown, a system 10 includes a processor 15 coupled to a DRAM device 11 via a bus 17. DRAM device 11 includes an array of memory cells 20, row decoders and drivers 12, sense amplifiers 16, and a column decoder and multiplexer 14. DRAM device 11 also includes a control circuit 28 and a refresh controller 26. After receiving control signals from processor 15 via bus 17, control circuit 28 provides corresponding internal control signals to various circuits within DRAM device 11 to perform read, write, refresh, or idle operations. Control circuit 28 also receives refresh requests from refresh controller 26.

Memory cells 20 can be refreshed with a row-by-row refresh process, i.e., all memory cells in a given one of rows 21 are simultaneously refreshed. Refresh controller 26 determines when and which of memory cells 20 need to be refreshed, and control circuit 28 refreshes each of rows 21 at a time using a refresh address supplied by refresh controller 26.

Conventional memory controllers generally paid little attention to the scheduling of refresh operations because refresh penalties (i.e., conflicts with read and/or write operations) are seldom, if ever, a problem. Thus, many conventional memory controllers, as mentioned previously, tend to use the most straight-forward refresh scheduling algorithm that simply forces a refresh operation to be sent as soon as the $t_{REFI}$ interval expires. This approach is very common due to the simplicity of control logic hardware required. As the refresh time increases with higher density memories, refresh penalty is becoming an issue for system designers, and a more sophisticated refresh scheduling algorithm is desirable for handing refresh operations in high-density memories.

It has been observed that the probability of receiving a second memory operation (such as read or write) decreases as the time after the completion of a first memory operation increases. Hence, the insertion of a delay before issuing a Refresh command can reduce the likelihood that the execution of a refresh operation may interfere with the impending execution of a new memory operation. Thus, after all Bank Queues for a memory rank are empty, a refresh scheduling mechanism of the present invention inserts an idle delay before issuing a Refresh command. In contrast, conventional refresh scheduling mechanisms immediately issue Refresh commands as soon as all Bank Queues for a memory rank are empty.

Figure 2:
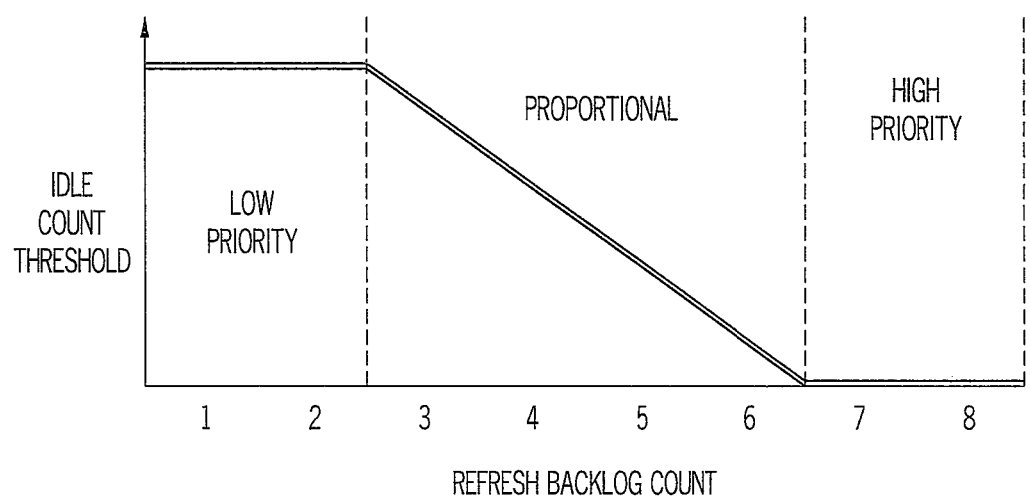
FIG. 2 shows the characteristics of an Idle Delay Function in accordance with a preferred embodiment of the present invention.

In essence, the insertion of an idle delay further lowers the priority of a refresh operation. The idle delay can be expressed as a function of the refresh backlog count (or refresh delay count). The general form of this function, which can be referred as an Idle Delay Function, is illustrated in FIG. 2. The Idle Delay Function has three distinct regions, namely, a Low-Priority region, a Proportional region and a High-Priority region. Each of the three regions of the Idle Delay Function can be dynamically adjusted according to the workload characteristics. The three regions of the Idle Delay Function are described as follows.

Many workloads in an electronic system have a characteristic idle delay period during which the probability of receiving a memory command within the $t_{RFC}$ interval is very low. Thus, the Idle Delay Function is set to a maximum idle delay value during this period, which is represented by the Low-Priority region.

The Proportional region represents the time frame when the refresh backlog count approaches a predetermined value (3, for example, in FIG. 2) after which a refresh controller needs to start considering the process of issuing Refresh commands in a more aggressive manner. The slope of the Idle Delay Function during the Proportional region can be dynamically adjusted in order to exploit the full range of all delayed refresh operations.

As the number of delayed refresh requests (i.e., refresh backlog count) approaches a maximum value (7, for example, in FIG. 2), a refresh operation can no longer be delayed and must be issued within one additional $t_{REFI}$ interval. From this perspective, the High-Priority region has two phases, both with an idle delay of zero. With the present embodiment, at a refresh backlog count of 7, a refresh controller will send a Refresh command as soon as a Bank Queue becomes empty. In addition, at a refresh delayed count of 8, the Refresh command will be issued before any other memory commands, and as soon as the DRAM bus parameters permit.

Since the optimal characteristics of the Idle Delay Function can be workload-dependent, a set of parameters need to be defined in order to configure the Idle Delay Function shown in FIG. 2. These parameters are listed in Table I.

TABLE I

| Parameters | Units | Description |
| --- | --- | --- |
| Max delay | Memory clocks | Set delay in Low-Priority region |
| Proportional slope | Memory clocks; Delayed step | Set slope in Proportional region |
| High-priority pivot point | Delayed step | Set point at which idle delay goes to zero |

The Max delay and Proportional slope parameters can be determined via two hardware structures that profile the workload references.

The goal of the Proportional region is to dynamically center the distribution of refresh operations in the postponed spectrum. This can be accomplished by tracking the relative frequency of refresh operations across a postponed pivot point. This postponed pivot point is the target average refresh execution point. For the present embodiment, a postponed count of 4 is utilized, reflecting the midpoint of the deferral range.

The High-priority pivot point (the transition from Proportional region to High-Priority region) can be fixed at 7 delayed refresh counts, as this was effective to prevent forcing High Priority unnecessarily for the present embodiment.

The hardware structures for implementing the Idle Delay Function from FIG. 2 can be divided into a basic static control mechanism and hardware for dynamically adjusting Max delay, Proportional slope, and High-priority pivot point parameters. For the basic static control mechanism, each memory rank requires a 10-bit idle counter. In addition, Max delay, Proportional slope, and High-priority pivot point parameters require 10-bit, 7-bit, and 3-bit registers, respectively. The hardware for dynamically adjusting the Max delay parameter requires an addition of a 20-bit wide, 10-bit input accumulator and a 10-bit counter. The hardware for generating Proportional slope term includes two 16-bit High/Low counters, a 16-bit integral accumulator, and a 7-bit two-input accumulator. The size of all of the above-mentioned hardware components are negligible compared to the size of a memory controller or refresh controller.

Figure 3A:
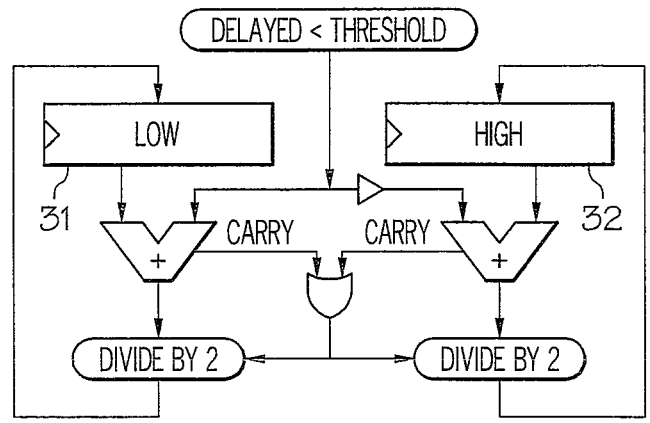
FIGS. 3a-3b depict hardware structures for implementing the Idle Delay function from FIG. 2, according to one embodiment of the present invention.
Figure 3B:
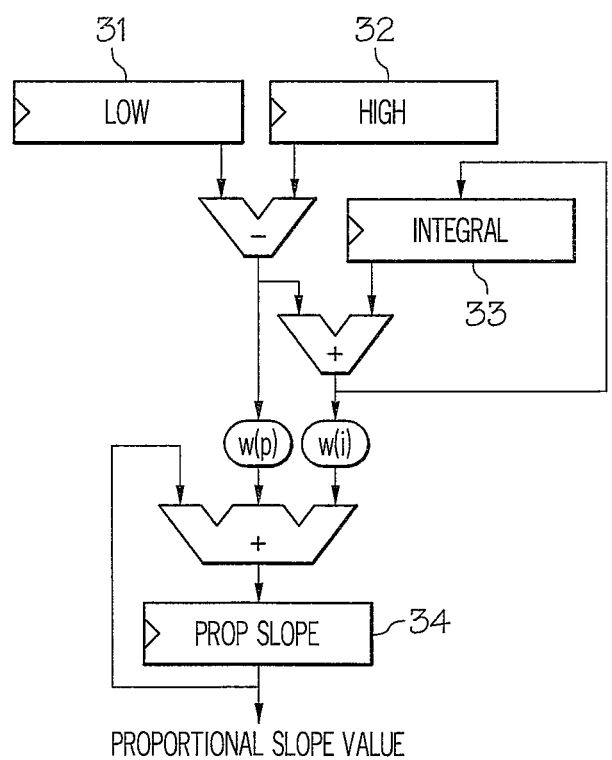

Referring now to FIGS. 3a-3b, there are depicted hardware structures for implementing the Idle Delay Function from FIG. 2. As shown, the structure includes a Low counter 31 and a High counter 32, each containing the frequency of operations that fall on the low and high sides of the High-Priority pivot point, respectively. When either one of Low and High counters 31, 32 overflows, the values in all related counters are divided in half by right-shifting each register by one. The scheme operates over profiling intervals, which are followed by adjustments at the end of each interval. At each adjustment interval, the logic subtracts the values of High and Low counters 31, 32. The value is applied to a proportional integral counter 33 to update the Proportional Slope parameter for the subsequent interval. Circuits for resetting Low and High counters 31, 32 after each adjustment interval are not shown in FIGS. 3a-3b.

For the present embodiment, Low counter 31, High counter 32, and integral counter 33 are 16 bits wide. A relatively short adjustment interval of 128 k memory clocks is utilized since the profiling structure has a fairly small amount of Low counter 31 and High counter 32 update logic state and stabilizes quickly. A 7-bit register 34 is utilized to generate a Proportional Slope value that represents the slope of the Proportional region of the Idle Delay Function from FIG. 2 (units of decrease in delay cycles per postponed step). The w(p) and w(i) weighing functions of integral counter 33 utilize simple power-of-two division that can be accomplished by truncating the value to largest 5-bit value (shifting off up to 11 leading zeros).

According to the JEDEC standard, DRAM devices that support low power states can be exploited to lower memory power beyond the normal "idle state" when the DRAM devices are not currently being accessed. Which low power state should be used depends on the trade off between power and wake up time and is not pertinent to the present invention. Transitions between the idle state and a low power state are controlled by the issuance of "Enter Power-down" and "Exit Power-down" commands. A Read, Write or Refresh command cannot be issued to a DRAM device unless the DRAM device is in the Idle state. Therefore, if a DRAM device is in a low power state when a Read, Write or Refresh command needs to be issued, an Exit Power-down command must be issued first.

Depending on the memory power management policy in place, a memory controller scheduler may power down a specific rank of DRAM devices (i.) immediately after issuing a Read/Write command targeting that specific rank, (ii.) after some minimum idle period following a Read/Write command or (iii.) never. So when a Refresh Idle Delay time expires, the target rank of DRAM devices may or may not already be powered up.

It is generally desirable to minimize the number of power state transitions because the issuance of Enter Power-down and Exit Power-down commands also consumes power. Thus, it is beneficial from a power saving standpoint to defer the power-up of a rank of DRAM devices for as long as possible. As such, it is preferable to further delay a refresh operation when a targeted rank of DRAM devices is in a powered down state until such time that either the refresh operation can simply no longer be deferred, or until the targeted rank of DRAM devices is powered up for some other command (such as a Write command).

If the Refresh Idle Delay time has expired, and the targeted rank of DRAM devices is already powered up (i.e., in the Idle state), then a Refresh command will be issued. If the Refresh Idle Delay time has expired, and the targeted rank of DRAM devices is in a powered down state, then a Refresh command should be postponed depending on the refresh backlog count.

Once the refresh backlog reaches a programmable predetermined threshold, the memory controller will proceed to power up the rank of DRAM devices in order to issue one or more Refresh commands. When this predetermined threshold is exceeded, the targeted rank of DRAM devices will be powered up and a Refresh command should be issued as soon as the refresh wait time expires.

When a Refresh command is eventually issued, it is desirable to issue more than one Refresh command in order to drain the backlog down to a low value, provided that there are no Read commands waiting to access the same rank of DRAM devices.

Figure 4:
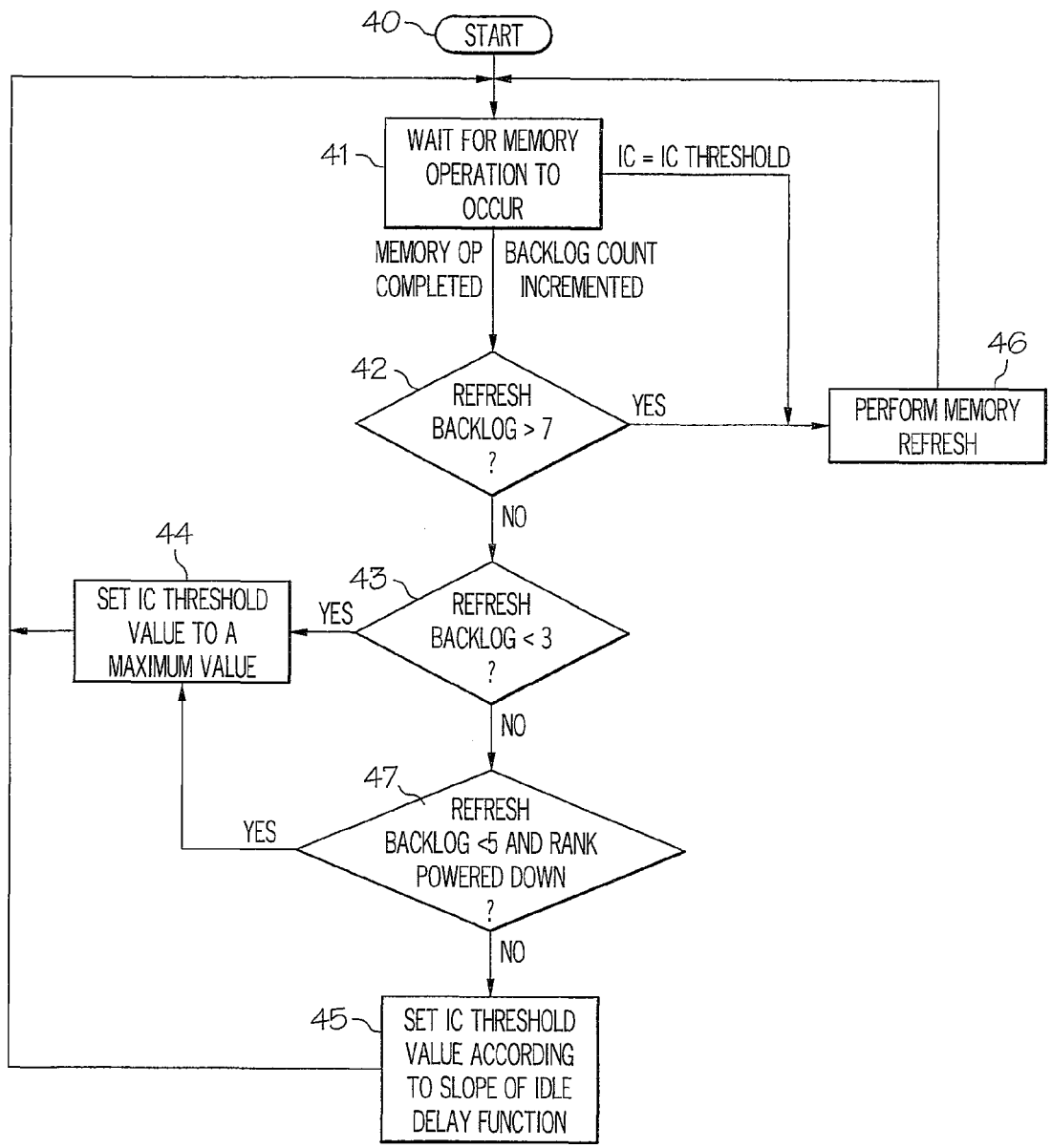
FIG. 4 is a high-level logic flow diagram of a method for performing refresh operations, in accordance with a preferred embodiment of the present invention.

With reference now to FIG. 4, there is illustrated a high-level logic flow diagram of a method for performing refresh operations, in accordance with a preferred embodiment of the present invention. Starting at block 40, the process waits for a memory operation, such as a read or write operation, to occur, as shown in block 41. While waiting for an occurrence of a memory operation, if the Idle Count value equals the Idle Count threshold value, then a refresh operation will be performed as soon as possible, as shown in block 46, or if the Refresh backlog count is incremented, a determination is then made whether or not a refresh backlog count is greater than 7, as depicted in block 42. Similarly, once a memory operation has occurred and completed, the process proceeds to block 42.

If the refresh backlog count is greater than 7, then the Idle Count threshold is set to zero (or close to zero) such that a refresh operation is performed as soon as possible, as shown in block 46. This corresponds to the High-Priority region of FIG. 2. The process then returns to block 41.

However, if the refresh backlog count is not greater than 7, then another determination is made whether or not the refresh backlog count is less than 3, as shown in block 43. If the refresh backlog count is less than 3, then the Idle Count threshold value is set to a maximum value, as depicted in block 44, such that a refresh operation is performed (i.e., in block 46) after a maximum Idle Count threshold value of time has lapsed. This corresponds to the Low-Priority region of FIG. 2. The maximum Idle Count threshold value of current server grade DRAM devices depends on the specified refresh interval ($t_{REFI}$), which at present is 7.8 microseconds, and is independent of the device density. The process then returns to block 41.

Otherwise, if the refresh backlog count is not less than 3, then a determination is made whether or not the refresh backlog count is less than 5, and a rank of memory devices is in a powered down state, as shown in block 47. If the refresh backlog count is less than 5, and the rank of memory devices is in a powered down state, then the Idle Count threshold value is set to a maximum value, as depicted in block 44, such that a refresh operation is performed (i.e., in block 46) after a maximum Idle Count threshold value of time has lapsed. However, if the refresh backlog count is not less than 5, or the rank of memory devices is not in a powered down state, then the Idle Count threshold value is set to according to the slope of the Idle Delay Function, as shown in block 45. The slope of the Idle Delay Function is determined by the hardware structure from FIG. 3b, and the value can be adjusted according to the desired refresh aggressiveness and load requirement. For example, the Idle Count threshold value decreases linearly as the refresh backlog count increases. This corresponds to the Proportional region of FIG. 2. The process then returns to block 41.

As has been described, the present disclosure provides a method and apparatus for performing refresh operations in high-density memories.

While an illustrative embodiment of the present invention has been described in the context of hardware, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. Examples of the types of media include recordable type media such as thumb drives, floppy disks, hard drives, CD ROMs, DVDs, and transmission type media such as digital and analog communication links.

While the disclosure has been particularly shown and described with reference to a preferred embodiment, it will be understood by those skilled in the art that various changes in form and detail may be made therein without departing from the spirit and scope of the disclosure.

What is claimed is:

1. A non-transitory computer readable medium having a computer program product for performing refresh operations, said computer readable medium comprising:

program code for, in response to a completion of a memory operation, determining whether or not a refresh backlog count is greater than a first predetermined value;

program code for, in a determination that said refresh backlog count is greater than said first predetermined value, performing a refresh operation as soon as possible;

program code for, in a determination that said refresh backlog count is not greater than said first predetermined value, determining whether or not said refresh backlog count is less than a second predetermined value;

program code for, in a determination that said refresh backlog count is not less than said second predetermined value, determining whether or not said refresh backlog count is less than a third predetermined value and said rank of memory devices is in a powered down state;

program code for, in a determination that said refresh backlog count is less than said third predetermined value and said rank of memory devices is in a powered down state, setting an Idle Count threshold value to a maximum value such that a refresh operation will be performed after a maximum delay time; and program code for, in a determination that said refresh backlog count is not less than said third predetermined value or said rank of memory devices is not in a powered down state, setting said Idle Count threshold value based on the slope of an Idle Delay Function such that a refresh operation will be performed accordingly.

2. The computer readable medium of claim 1, wherein said first predetermined value is 7.

3. The computer readable medium of claim 1, wherein said second predetermined value is 3.

4. The computer readable medium of claim 1, wherein said third predetermined value is 5.

5. The computer readable medium of claim 1, wherein said idle count value is negatively proportional to said refresh backlog count.

6. The computer readable medium of claim 1, wherein said computer readable medium further includes program code for, in a determination that said refresh backlog count is less than said second predetermined value, setting said Idle Count threshold value to said maximum value.

7. An apparatus for performing refresh operations, said apparatus comprising:
a comparator for, in response to a completion of a memory operation, determining whether or not a refresh backlog count is greater than a first predetermined value; and
a memory controller
for performing a refresh operation as soon as possible, in a determination that said refresh backlog count is greater than said first predetermined value,
for determining whether or not said refresh backlog count is less than a second predetermined value, in a determination that said refresh backlog count is not greater than said first predetermined value,
for determining whether or not said refresh backlog count is less than a third predetermined value and said rank of memory devices is in a powered down state, in a determination that said refresh backlog count is not less than said second predetermined value,
for setting an Idle Count threshold value to a maximum value such that a refresh operation will be performed after a maximum delay time, in a determination that said refresh backlog count is less than said third predetermined value and said rank of memory devices is in a powered down state, and
for setting said Idle Count threshold value based on the slope of an Idle Delay Function such that a refresh operation will be performed accordingly, in a determination that said refresh backlog count is not less than said third predetermined value or said rank of memory devices is not in a powered down state.

8. The apparatus of claim 7, wherein said first predetermined value is 7.

9. The apparatus of claim 7, wherein said second predetermined value is 3.

10. The apparatus of claim 7, wherein said third predetermined value is 5.

11. The apparatus of claim 7, wherein said idle count value is negatively proportional to said refresh backlog count.

\* \* \* \* \*